United States Patent
Crowley et al.

(10) Patent No.: US 9,406,487 B2
(45) Date of Patent: Aug. 2, 2016

(54) PLASMA ENHANCED CHEMICAL VAPOR DEPOSITION (PECVD) SOURCE

(71) Applicant: Sputtering Components, Inc., Owatonna, MN (US)

(72) Inventors: Daniel Theodore Crowley, Owatonna, MN (US); Patrick Lawrence Morse, Tuscon, AZ (US); William A. Meredith, Jr., Faribault, MN (US); John Robert German, Owatonna, MN (US); Michelle Lynn Neal, Albert Lea, MN (US)

(73) Assignee: Sputtering Components, Inc., Owatonna, MN (US)

( * ) Notice: Subject to any disclaimer, the term of this patent is extended or adjusted under 35 U.S.C. 154(b) by 95 days.

(21) Appl. No.: 14/138,833

(22) Filed: Dec. 23, 2013

(65) Prior Publication Data
US 2014/0184073 A1    Jul. 3, 2014

Related U.S. Application Data

(60) Provisional application No. 61/746,734, filed on Dec. 28, 2012.

(51) Int. Cl.
*H01J 7/24* (2006.01)
*H05B 31/26* (2006.01)
*H01J 37/34* (2006.01)

(52) U.S. Cl.
CPC ............ *H01J 37/3405* (2013.01); *H01J 37/345* (2013.01); *H01J 37/3417* (2013.01); *H01J 37/3438* (2013.01); *H01J 37/3444* (2013.01)

(58) Field of Classification Search
USPC .......... 315/111.41, 5.31, 39.51, 39.57; 331/5, 331/86–90
See application file for complete search history.

(56) References Cited

U.S. PATENT DOCUMENTS

| | | | | |
|---|---|---|---|---|
| 4,915,805 | A * | 4/1990 | Rust | H01J 37/3405 204/192.12 |
| 5,019,117 | A * | 5/1991 | Nakamura | C23C 16/511 118/723 MR |
| 5,334,302 | A | 8/1994 | Kubo et al. | |
| 6,444,945 | B1 * | 9/2002 | Maschwitz | C23C 14/243 118/723 E |
| 7,327,089 | B2 * | 2/2008 | Madocks | H01J 27/146 118/723 DC |
| 7,411,652 | B2 * | 8/2008 | Bleeker | G03F 7/70283 355/53 |
| 9,136,086 | B2 | 9/2015 | Madocks | |

(Continued)

FOREIGN PATENT DOCUMENTS

| | | |
|---|---|---|
| DE | 19928053 | 1/2001 |
| JP | 07006998 | 1/1995 |

(Continued)

OTHER PUBLICATIONS

U.S. Appl. No. 14/138,833, Adam Houston.*

(Continued)

*Primary Examiner* — Adam Houston
(74) *Attorney, Agent, or Firm* — Fogg & Powers LLC

(57) ABSTRACT

One embodiment is directed to a plasma source comprising a body in which a cavity is formed and at least two self-contained magnetron assemblies disposed within the cavity. The magnetron assemblies are mutually electrically isolated from each other and from the body. In one implementation of such an embodiment, the self-contained magnetron assemblies comprise closed-drift magnetron assemblies. Other embodiments are disclosed.

20 Claims, 8 Drawing Sheets

(56) References Cited

U.S. PATENT DOCUMENTS

| | | | |
|---|---|---|---|
| 2004/0155592 A1* | 8/2004 | Madocks | C23C 16/50 315/111.21 |
| 2004/0217713 A1* | 11/2004 | Madocks | H01J 37/3405 315/111.41 |
| 2004/0264044 A1* | 12/2004 | Konishi | C23C 14/022 360/110 |
| 2005/0103620 A1* | 5/2005 | Chistyakov | C23C 14/0063 204/192.12 |
| 2005/0247885 A1* | 11/2005 | Madocks | F03H 1/0075 250/423 R |
| 2006/0000705 A1* | 1/2006 | Hartig | H01J 37/3405 204/192.12 |
| 2007/0181417 A1* | 8/2007 | Chistyakov | C23C 14/352 204/192.1 |
| 2008/0099329 A1* | 5/2008 | Pavloff | C23C 14/35 204/298.16 |
| 2009/0242131 A1* | 10/2009 | Mai | H01J 37/32192 156/345.42 |
| 2011/0226611 A1 | 9/2011 | Madocks | |
| 2014/0061030 A1* | 3/2014 | Krassnitzer | C23C 14/352 204/192.12 |
| 2014/0102888 A1* | 4/2014 | Harkness, IV | C23C 14/352 204/298.03 |
| 2014/0184073 A1* | 7/2014 | Crowley | H01J 37/3405 315/111.41 |
| 2014/0238843 A1* | 8/2014 | Nguyen | H01J 37/3408 204/192.12 |

FOREIGN PATENT DOCUMENTS

| | | |
|---|---|---|
| JP | 2004200429 | 7/2004 |
| WO | 2010077659 | 7/2010 |

OTHER PUBLICATIONS

International Searching Authority, "International Search Report and Written Opinion from PCT Application No. PCT/US2013/077474 mailed Apr. 14, 2014", "from PCT Counterpart of U.S. Appl. No. 14/138,833", Apr. 14, 2014, pp. 1-12, Published in: WO.

The International Bureau of WIPO, "International Preliminary Report on Patentability for PCT Application No. PCT/US2013/077474 mailed Jul. 9, 2015", "from PCT Counterpart of U.S. Appl. No. 14/138,833", Jul. 9, 2015, pp. 19, Published in: WO.

Taiwan Patent Office, "Notice of Allowance from TW Application No. 102224495 mailed Sep. 11, 2014", "from Foreign Counterpart of U.S. Appl. No. 14/138,833", Sep. 11, 2014, pp. 13, Published in: TW.

European Patent Office, Third Party Observations from EP Application No. 13867574.9 mailed Jul. 8, 2015, from Foreign Counterpart of U.S. Appl. No. 14/138,833, Jul. 8, 2015, pp. 1-82, Published in: EP.

European Patent Office, Extended European Search Report from EP Application No. 13867574.9 mailed Apr. 21, 2016, from Foreign Counterpart of U.S. Appl. No. 14/138,833, Apr. 21, 2016, pp. 1-8, Published in: EP.

* cited by examiner

PLASMA ENHANCED CHEMICAL VAPOR DEPOSITION (PECVD) SOURCE

CROSS-REFERENCE TO RELATED APPLICATION

This application claims the benefit of U.S. Provisional Patent Application Ser. No. 61/746,734, filed on Dec. 28, 2012, which is hereby incorporated herein by reference.

BACKGROUND

Chemical vapor deposition (CVD) refers to processes in which layers are formed on the surfaces of substrates by chemical conversion of a precursor chemistry that contains the elements of which the desired layers are comprised. A common example is the formation of silicon dioxide ($SiO_2$) from chemical reactions between the precursor hexamethyldisiloxane, or HMDSO ($O[Si(CH_3)_3]_2$), and oxygen ($O_2$). In this case, the silicon and oxygen combine to form the solid $SiO_2$. The remaining methyl groups can also react with the oxygen to form various waste gasses ($CO$, $CO_2$, $HO$, etc.) that are then removed from the reactor.

To improve the efficiency of the reaction and the quality of the deposited layers, the reaction can take place in an atmosphere of ionized gas (plasma). A typical gas for generating the plasma is Argon. Reactive gasses that may be used in the chemical reactions can also be added. Suitable plasma will have a high density of energetic electrons. The electrons undergo collisions with the precursor, and other gasses containing the elements of interest, thus ionizing the gasses and dissociating their molecules into lighter fractions. This produces radicals of the elements of interest, which form the desired compounds more readily than they would without being subjected to the plasma. Adjustments of the ratios of gasses, pressure, or power parameters can be made to affect the rate of deposition and film properties.

Plasma is generated within a vacuum chamber, at a pressure in the range of about 1-100 mTorr, by providing ionizable gas and electrodes within the chamber and then applying an electrical potential between the electrodes. When the electrical potential is applied, electrons are emitted from the surface of the cathodic electrode and will be accelerated by the electric field between the cathode and anode. When electrons of sufficient energy collide with process gas, the gas can be ionized and additional free electrons are generated. The new electrons are also subjected to the accelerating electric field and can act to ionize additional gas molecules. Under suitable conditions, this process quickly cascades to form dense plasma. It is common to further provide magnetic fields that are configured to alter the trajectories of the electrons so as to entrain them within a desired work area and increase the probability of undergoing ionizing collisions, hence, improving the efficiency of the process.

A variety of configurations can be found in the prior art for generating plasma. But, they generally have shortcomings that limit their performance for PECVD processes. A summary of such sources can be found in U.S. Pat. No. 7,327,089 (also referred to here as the "'089 Patent"), hereby included in its entirety by reference.

In the '089 Patent (and subsequent continuation U.S. Pat. No. 7,411,652 (also referred to here as the "652 Patent")), a source comprising an electrode confined within a cavity is described. The cavity is open to the process area of the vacuum chamber through a nozzle that restricts the flow of plasma. The nozzle also limits the flow of sputtered materials out of the cavity and the flow of the chemical precursor into the cavity. A means for supplying the process gasses within the cavity is provided. The precursor is supplied to the chamber outside the cavity. This configuration addresses the concerns of reacted materials forming on the electrode and of sputtered material contaminating the film that forms on the substrate. This source also incorporates a magnetic field that provides magnetic confinement of the electrons within the source to enhance the efficiency in generating dense plasma. The magnetic field configuration also provides guidance for a portion of the plasma to flow out of the cavity towards the substrate.

An issue with the source described in the '089 Patent is that it relies on an anode that is outside the cavity of the source. Being outside the source, the anode is subject to deposition of dielectric coatings created by the process. As one skilled in the art can appreciate, dielectric coating on anodes invariably leads to process instability and unacceptable non-uniformity. Additionally, the electrode disposed within the cavity is subject to oxidation (or other reactions) from the processes gasses being used. Both problems are alleviated by connecting two of the sources together with an alternating-current (AC) or bi-polar pulsed power supply as described in the '652 Patent. In this configuration, the electrode in one source is at cathode potential while the electrode in the other source acts as the anode. The two electrodes switch polarity on each half-cycle of the power supply. On the cathodic half-cycle, the electrode experiences sputtering. This can at least partially clean off undesired reactants.

An important feature on the two-source configuration described in the '652 Patent is that the two sources can be magnetically linked by means of having opposite magnetic polarities. This is an efficient way of directing the working electrons out of the sources and into the work area, since the electrons will follow the magnetic field as they move between cathode and anode. Although the two-source configuration reduces the coated or reacted electrode problems, it creates another problem. The uniformity of the electron travel between sources is highly dependent on the uniformity of the magnetic field linking the sources. Even if great care is taken to make the magnetic structure within each source highly uniform, it can be extremely challenging to make the linking magnetic field between the sources uniform. This is due to the distance between the sources. Since the strength of the magnetic field (flux density) diminishes as a function of the square of the distance, small variations in the distance between sources can result in significant changes in magnetic flux density. This results in unacceptable changes in the process. The two sources must therefore be precisely parallel, which implies that they must also be precisely straight in order to maintain a uniform process. The longer the sources get, the more challenging it gets to achieve and maintain adequate precision.

In German Patent DE 199 28 053 (also referred to here as the "'053 Patent"), a plasma source comprising cathodes and redundant anodes arranged within a cavity is disclosed. This source comprised three parallel cathode electrodes constructed of magnetically permeable material, such as steel. One of the three is a solid slab that can be disc shaped. Alternately, it can have a rectangular or oval shape. For simplicity, only the disc shaped configuration will be discussed here. The other two cathodes are annular shaped and have substantially the same thickness and outer diameter as the disc-shaped cathode. Disposed between and connecting the cathodes are permanent magnets arranged in a ring that interface the cathodes on the flat surfaces and along the outer diameter of the cathodes. The assembly of the cathodes and magnets produce an enclosed cylindrical structure with a cavity in the center, which is open at one at one end of the cylinder. This assembly is simultaneously the main electrode and magnetic circuit of the plasma source. Disposed within the cavity and between the cathodes are additional electrodes that are mutually electrically isolated from each other and from the cathodes. The electrodes are cylindrical shaped loops with an inner diameter slightly larger than the inner diameter of the cathodes and outer diameter less than the inner diameter of the ring of magnets. Their lateral dimension is less that the distance between cathodes. These electrodes, which serve as anodes, are disposed between and concentric with the cathodes. The electrode anodes are electrical components only and are not part of the magnetic circuit.

In the disc shaped configuration disclosed in the '053 Patent, the magnetic polarity is arranged so that the field permeates the permeable cathodes in a radial direction and emanate out of the cathodes at or near the inner diameter surfaces. The field lines form arcs in the space between the cathodes, substantially parallel to the axis of symmetry of the assembly and substantially bridging the inner diameter surfaces of the anodes. In this way, electrons emitted from the cathodes are entrained between the cathodes since the electrons cannot readily cross the magnetic field lines to reach the anode. The result is a build-up of electron-rich plasma within the cavity. A portion of the electrons escapes the source along its center axis and towards the substrate.

In the disc shaped configuration disclosed in the '053 Patent, a DC power supply is connected between the cathodes and ground and maintains the cathodes at cathode potential. Two separate square-wave power supplies are connected between the anode electrodes and the cathodes. These power supplies are alternately pulsed so that one electrode is at anode potential while the other is at cathode potential. Periodically driving one anode at a time to cathode potential allows the system to always maintain an active anode while sputter-cleaning the other. In this fashion, the anodes are kept at least partially clean and functional.

Since all electrodes are in close physical proximity in the disc shaped configuration disclosed in the '053 Patent, establishing and maintaining adequately uniform magnetic pathways for the electrons becomes much easier. The '053 Patent appears to have remedied the issue of non-uniformity of the '652 Patent, while maintaining the benefits realized by the systems of both the '089 Patent and the '652 Patent. Additionally, the source described in the '053 Patent can be made much more compact than the system disclosed in the '652 Patent and therefore can be more readily retro-fitted into older systems. However, the arrangement described in '053 Patent is unnecessarily complicated and practical models are difficult to design and manufacture due to the requirement to provide cooling and power utilities to three separate electrical components. A significant process concern for the design of the '053 Patent is that the main cathode is a current carrying electrode that is driven with a DC voltage. Since it is exposed to the process, it may be subject to coating with dielectric material. It is well known to those skilled in the art that this can lead to process instability through arcing.

SUMMARY

One embodiment is directed to a plasma source comprising a body in which a cavity is formed and at least two self-contained magnetron assemblies disposed within the cavity. The magnetron assemblies are mutually electrically isolated from each other and from the body. In one implementation of such an embodiment, the self-contained magnetron assemblies comprise closed-drift magnetron assemblies.

Another embodiment is directed to a method of sourcing plasma. The method comprises supplying a process gas to a cavity formed within a body of a plasma source, the plasma source comprising at least two self-contained magnetron assemblies disposed within the cavity, wherein the magnetron assemblies are mutually electrically isolated from each other and from the body. The method further comprises supplying a precursor gas to the plasma source and alternately biasing respective electrodes in the magnetron assemblies to have polarities opposite to one another.

Another embodiment is directed to a plasma source comprising a body in which a cavity is formed, at least one self-contained magnetron assembly disposed within the cavity, and at least two non-magnetron electrodes disposed within the cavity. The plasma source further comprises an alternating current (AC) power supply having an output coil. The at least two non-magnetron electrodes are mutually electrically isolated from each other and from the body incorporating the cavity. The magnetron assembly is connected to a center tap of the output coil of the AC power supply and the non-magnetron electrodes are connected to end taps of the output coil of the AC power supply.

DRAWINGS

DETAILED DESCRIPTION

Figure 1:
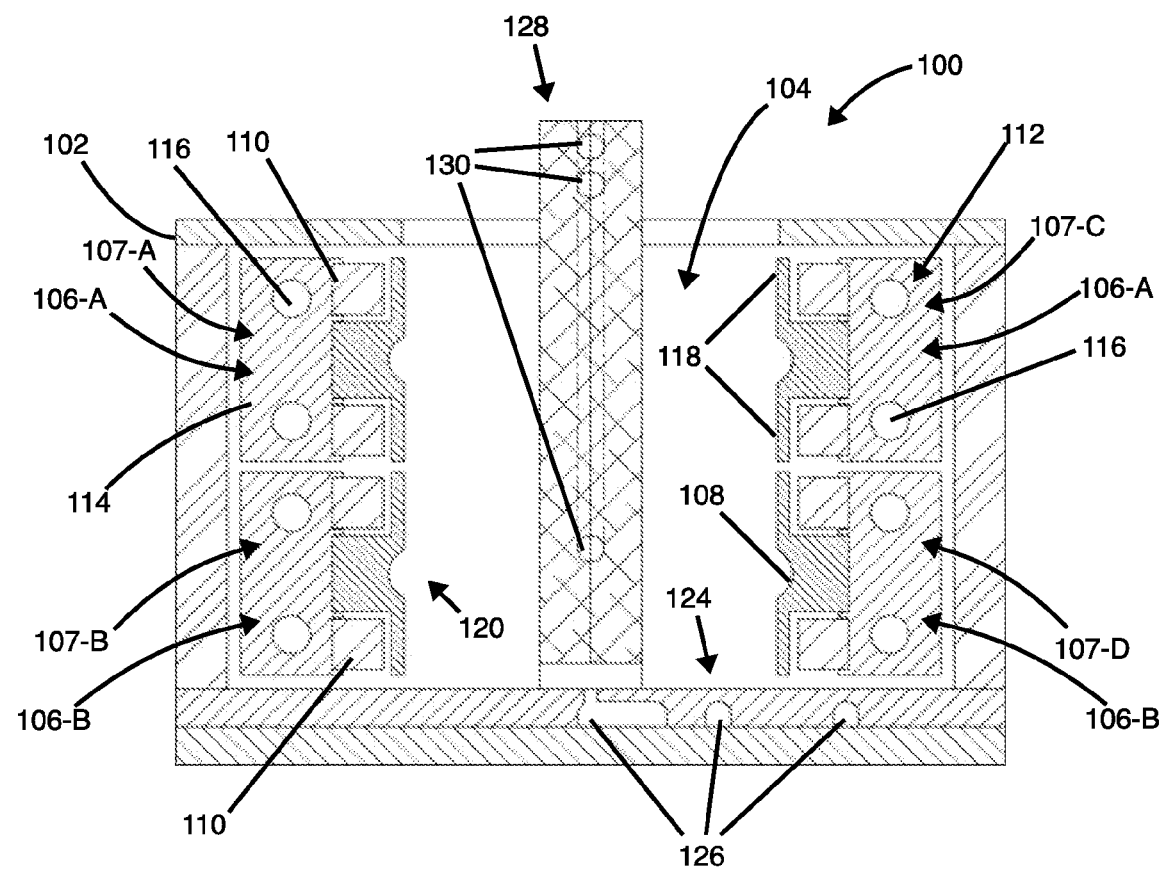
FIG. 1 is a cross-sectional diagram of one exemplary embodiment of a plasma source.

FIG. 1 is a cross-sectional diagram of one exemplary embodiment of a plasma source 100. The plasma source 100 comprises a housing or body 102 in which a cavity 104. The plasma source 100 comprises at least two complete self-contained, closed-drift magnetron assemblies 106 that are disposed within the cavity 104 and that are mutually electrically isolated from each other and from the body 102.

The term "self-contained" means that a magnetron assembly 106 comprises all necessary components of an operational magnetron, which comprise one or more electrodes 108, one or more magnets 110, and a cooling sub-system 112. In one implementation, the magnetron assemblies 106 are implemented as closed-drift magnetron assemblies.

In the exemplary embodiment shown in FIG. 1, each magnetron assembly 106 comprises a single electrode 108 and a pair of magnets 110, though other numbers of electrodes 108 or magnets 110 can be used. Each electrode 108 and magnet 110 can be formed as a single part or assembled from multiple component parts (in the latter of which each electrode 108 or magnet 110 could be considered an "electrode assembly" or "magnet assembly," respectively).

In the exemplary embodiment shown in FIG. 1, each magnetron assembly 106 further includes a core 114 that is not a part of the electrode 108 or the magnets 110. In this embodiment, the electrode 108 and magnets 110 are assembled onto the core 114.

In FIG. 1, the cross-sections of four magnetron assembly portions 107 are shown, where each of the four magnetron assembly portions 107 are individually referenced in FIG. 1 using the reference numerals 107-A, 107-B, 107-C, and 107-D, respectively.

In the particular embodiment described here in connection with FIG. 1, one complete magnetron assembly (individually referenced in FIG. 1 using the reference numeral 106-A) is formed as a ring structure located on the upper part of FIG. 1 that surrounds the precursor gas manifold 128 (described below), where the upper two magnetron assembly portions 107-A and 107-C are cross-sectional portions of that upper magnetron assembly 106-A. Likewise, the other complete magnetron assembly (individually referenced in FIG. 1 using the reference numeral 106-B) is formed as a ring structure located on the lower part of FIG. 1 that surrounds the precursor gas manifold 128, where the two magnetron assembly portions 107-B and 107-D are on the lower side of FIG. 1 are cross-sectional portions of that lower magnetron assembly 106-B. In the exemplary embodiment shown in FIG. 1, the body 102 is not a part of the electrode 108 or the magnets 110 and, in many applications, it is not desirable that the body 102 serves these functions.

It is noted, that unlike with the system described in the '053 Patent, no magnetically permeable materials (other than the magnets 110 themselves) are required in the magnetron assemblies 106.

Also, in this embodiment, the magnetron cooling sub-system 112 is implemented in each magnetron assembly 106 using one or more cooling channels 116 that are formed in each magnetron assembly 106. More specifically, in the exemplary embodiment shown in FIG. 1, the magnetron cooling sub-system 112 is implemented in each magnetron assembly 106 using one or more cooling channels 116 that are formed in the core 114 of each magnetron assembly 106.

As well understood by those of skill in the art, the cooling channels 116 are connected to a pump or other conventional mechanism (not shown) in order to pass a suitable cooling fluid (for example, water) through the cooling channels 116 in order to cool the corresponding magnetron assembly 106.

The electrode 108, magnets 110, and cooling sub-system 112 in each magnetron assembly 106 can be implemented in other ways. For example, the core 114 (if used) can be a part of an electrode assembly or a magnet assembly. Also, as noted above, a core 114 need not be used. Examples of such an approach include, without limitation, modifying the embodiment shown in FIG. 1 so that the structure shown in FIG. 1 as the core 114 is integrated with either the electrode 108 or one or both of the magnets 110. Furthermore, the magnetron assemblies 106 in the plasma source 100 need not all be implemented in the same way.

In the exemplary embodiment shown in FIG. 1, the magnetron assemblies 106 are electrically isolated from each other and from the body 102 by disposing the assemblies 106 within the cavity 104 of the plasma source 100 so that each assembly 106 is separated from the both the body 102 and the other assembly 106 by sufficient space to provide the desired electrical isolation. It is to be understood that this electrical isolation can be provided in other ways (for example, by using a suitable electrical insulator positioned between the magnetron assemblies 106 and/or between one or more of the magnetron assemblies 106 and the body 102).

Figure 2:
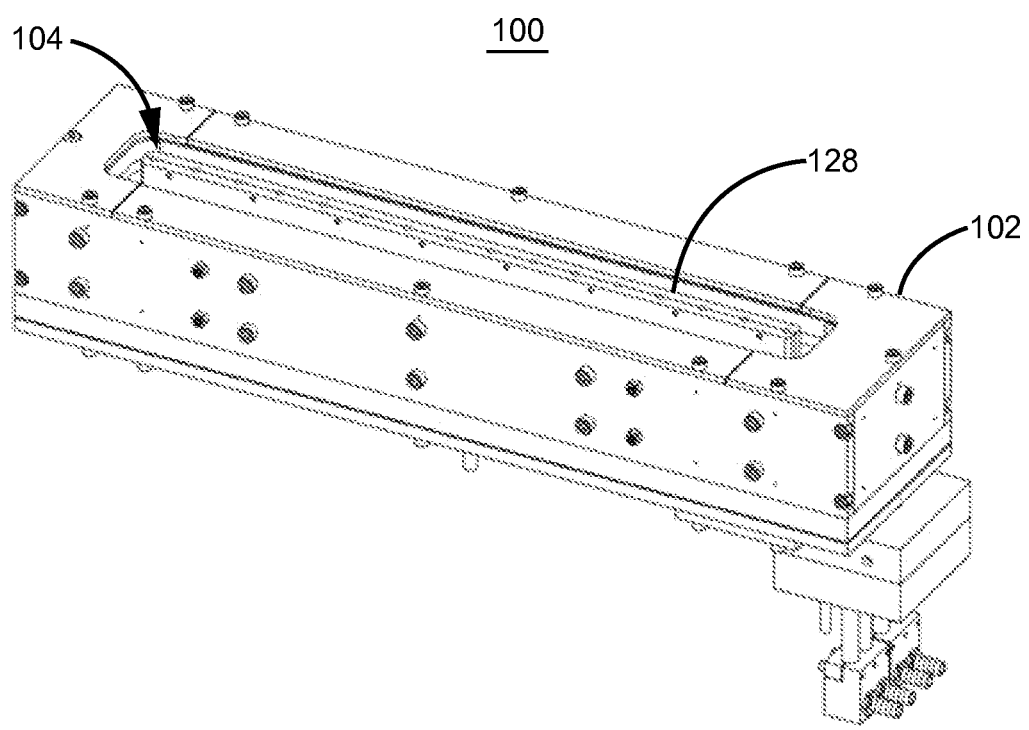
FIG. 2 is an isometric view of the plasma source shown in FIG. 1.

In the exemplary embodiment shown in FIG. 1, the magnetron assemblies 106 (and the components thereof) are generally configured to have rectilinear ring shape. This is illustrated in FIG. 2, which is an isometric view of the plasma source 100 shown in FIG. 1. Each electrode 108 and magnet 110 is formed as a rectilinear ring, with the two rings that form the magnets 110 in each magnetron assembly 106 concentrically disposed around the outer diameter of the ring that forms the electrode 108 of that magnetron assembly 106. More specifically, in the exemplary embodiment shown in FIG. 1, the ring that forms the electrode 108 in each magnetron assembly 106 has two opposing flanges 118. In this embodiment, one of the two rings that forms the magnets 110 of each magnetron assembly 106 is disposed behind the upper flange 118, and the other one of the two rings that forms the magnets 110 of that magnetron assembly 106 is disposed behind the lower flange 118.

The polarity of the magnets 110 are arranged to produce a magnetic field that arcs across the inner diameter of the target portion 120 of the electrode 108 of each magnetron assembly 106 in a direction that is substantially parallel to the center axis of the plasma source 100. The surface of the inner diameter of the target portion 120 is the active surface, and the other surfaces are made inactive by dark-spaces or insulators. Cooling of the target portion 120 can be provided directly by a channel for cooling liquid within the target portion. Alternately cooling can be provided indirectly by a channel 116 for cooling liquid within the core 114 (shown in FIG. 1), which is in thermal contact with the target portion 120.

The target portion 120 of the electrode 108, the magnets 110, and the optional core 114 can all be at the same electrical potential. A single AC or bi-polar pulsed power supply (not shown) is connected between the two magnetron assemblies 106 so that that the electrode 108 in one magnetron assembly 106 is alternately biased as a cathode and an anode, while the other electrode 108 in the other magnetron assembly 106 is alternately biased to have the opposite polarity (that is, as an anode and a cathode, respectively).

In one implementation of the embodiment shown in FIG. 2, the body 102 of the plasma source 100 can be at a floating potential. In other implementations, the body 102 can be at ground potential or biased to some other potential. The advantage of having the body 102 at floating potential is that it will gain a negative self-bias which will reject electrons, thereby helping to direct the electrons out of the cavity 104 towards the substrate (not shown). Self-biasing is due to electrons having much higher mobility that ions, thus impacting and sticking to surfaces at much higher rates. In other embodiments, biasing of the body 102 can be accomplished using a separate power supply or by adding an additional tap to the output coil of the power supply using diodes to rectify the power as necessary.

In one implementation of the embodiment shown in FIG. 1, the magnets 110 are oriented such that the direction of magnetization is in the radial direction with the two magnets 110 polarized in opposite directions. However, it is to be understood that other orientations of magnetic elements can be used. Typically, it is desirable that the resulting configuration of the magnetic field preferably directs electrons out of the plasma source 100, towards the substrate (not shown), and away from interior surfaces of the plasma source 100. In other embodiments, additional magnetic elements may be disposed elsewhere in the plasma source 100, away from direct contact with the magnetrons, so as to help optimize the magnetic field structure. The magnetic field structure can be further modified by disposing shunts, comprising magnetically permeably materials, in advantageous positions in the plasma source, including within the magnetron assemblies.

Electrode materials can be chosen to fit a particular process. In one example, the process may include a corrosive gas such as fluorine. So, a material resistant to corrosion, such as stainless steel, may be a desirable choice. In another example, a reactive gas such as oxygen may be used, in which case it may be desirable to choose an electrode material whose oxide sputters slowly and remains somewhat conductive upon oxidation. In this case, titanium may be desirable. Additionally, the active surfaces of the electrodes 108 may be coated with a material, as by plasma spray deposition, that is chosen to have a set of desired properties. One advantage of coating each electrode 108 is that the most desired material for active surface may not be feasibly formed into an electrode 108. Another advantage is that maintenance that may be required due to surface erosion may be a simple re-application of the electrode coating rather than a more expensive replacement of the electrode 108. A further consideration in choosing electrode materials is to use an electrode material that would produce sputtered contaminants that are the same material as the resulting film or a compatible contaminant that would not create any negative effects within the final coating. For example, a Si electrode could be used for SiO2 or SiN processes. In some cases, the electrode material may provide a useful dopant that enhances the properties of the deposited film.

Typically, the plasma source 100 comprises a manifold or other conduit 124 for providing process gasses to the magnetron assemblies 106. The manifold 124 used for providing processing gases is also referred to here as the "process gas manifold" 124. The process gases usually include a noble gas and at least one reactive gas (though other process gases can be used). In the exemplary embodiment shown in FIG. 1, the process gas manifold 124 is implemented using channels 126 built into the base of the body 102. The process gas manifold 124 can be implemented using various types of manifolds. For example, the process gas manifold 124 can be implemented using a binary manifold. A binary manifold is a manifold that has one input line. That input line spits into two equal and symmetric branches. Each of these branches, in turn, spits into two more equal and symmetric branches. The channels continue to split this way until there are sufficient branches spanning the circumference or length of the source. Properly designed, a binary manifold can provide highly uniform gas distribution.

Figure 3:
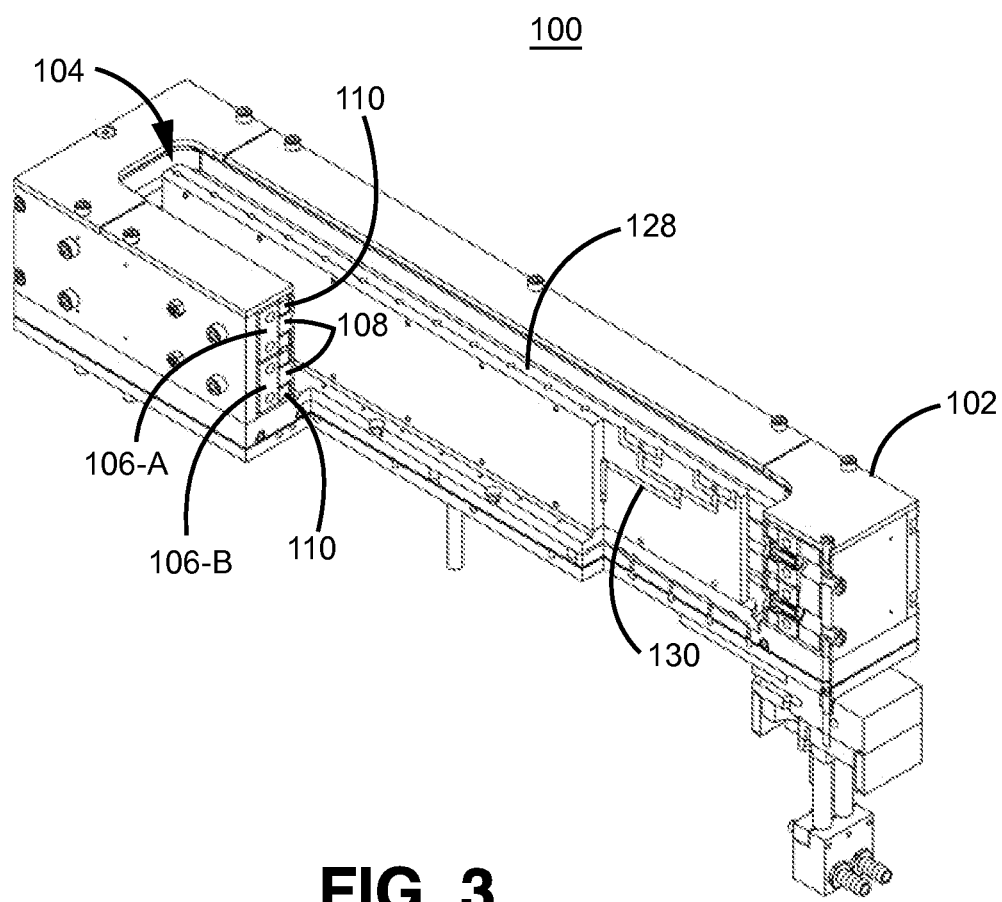
FIGS. 3 and 4 show a precursor gas manifold suitable that is implemented using a binary manifold.
Figure 4:
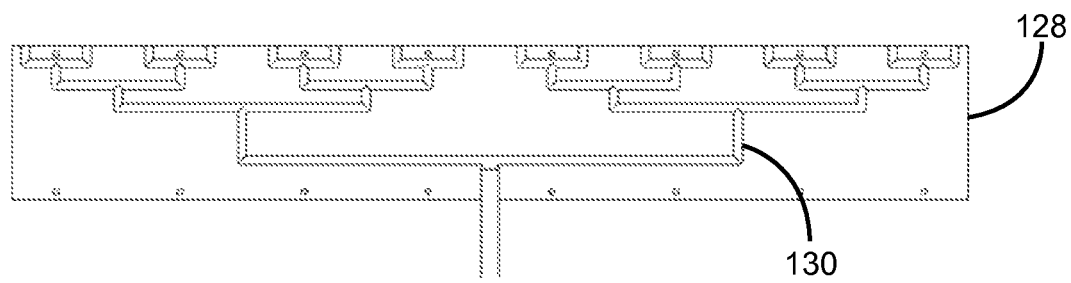

Also, the plasma source 100 typically comprises at least one other manifold or other conduit 128 for distributing a precursor gas. The manifold 128 used for providing processing gases is also referred to here as the "precursor gas manifold" 128. In the exemplary embodiment shown in FIG. 1, the precursor gas manifold 128 is implemented using a plurality of channels 130. Also, in this embodiment, the precursor gas manifold 128 is disposed in the center of the cavity 104 and extends outside the cavity 104, towards the substrate (not shown), in order to deliver the precursor gas outside of cavity 104 and near the substrate. In this embodiment, the outer surface of the precursor gas manifold 128 acts as a condensation shield that prevents sputtered material from any point of an electrode surface from re-depositing on other points of the electrodes 108. This avoids process stability issues associated with such re-deposition. Optionally, the additional manifold(s) can be disposed outside the plasma source 100. The precursor gas manifold 128 can be implemented using various types of manifolds. As shown in FIGS. 3 and 4, the precursor gas manifold 128 can be implemented using a binary manifold.

Figure 5:
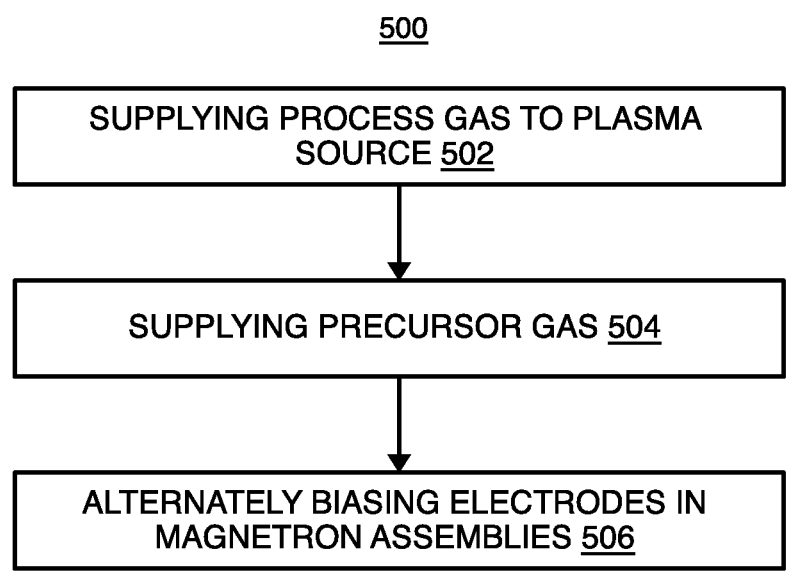
FIG. 5 is a flow diagram illustrating one exemplary embodiment of a method of sourcing plasma.

In operation, the plasma source 100 can be used to implement an exemplary embodiment of a method 500 of sourcing plasma. FIG. 5 is a flow diagram illustrating an exemplary embodiment of a method 500 of sourcing plasma. The method 500 shown in FIG. 5 is described here as being implemented using the plasma source 100 described above in connection with FIG. 1, though it is to be understood that method 500 can be implemented in other ways (for example, using the other plasma sources described here). Also, although method 500 is depicted in FIG. 5 with the elements of method 500 occurring in a particular sequential order for ease of explanation, it is to be understood that the elements of method 500 can occur in a different order or various elements can occur in parallel.

Method 500 comprises supplying a process gas to the cavity 104 formed within the body 102 of the plasma source (block 502); supplying a precursor gas to the plasma source 100 (block 504); and alternately biasing the respective electrodes 108 in the magnetron assemblies 106 to have polarities opposite to one another (block 506). Method 500 comprises one example of how plasma source 100 can be used in operation, though it is to be understood that plasma source 100 can used use in other ways.

Embodiments of the plasma sources described typically have the same advantages as the systems described the '089, '652, and '053 Patents. Moreover, embodiments of the plasma sources described here can be made simpler than the systems described in the '053 Patent. For example, by eliminating the cathode/magnetic-circuit/body assembly used in the systems described in the '053 Patent, and by replacing the anode-electrodes used in the systems described in the '053 Patent with complete magnetrons, the overall complexity of the plasma sources described here can be significantly reduced, thereby simplifying the plasma source design and power supply arrangement. Moreover, the plasma sources described here can also have processing advantage over the systems described in the '053 Patent in that the plasma sources described here do not need current-carrying DC electrodes, which can get coated with dielectric materials and cause arcing problems. The simplified structure of the plasma sources described here also minimizes difficulties associated with the maintenance of plasma sources. Even though the plasma sources described here are can be implemented using highly simplified designs, the advantages of the dual electrode arrangement of the system described in the '053 Patent are preserved in such plasma sources. Because there is always an active cathode in the plasma sources described here there is no loss of function compared to systems described the '053 Patent.

Although one exemplary embodiment is shown in FIGS. 1-5, it is to be understood that other embodiments can be implemented in other ways.

For example, in one alternate embodiment that is a variation of the embodiment shown in FIG. 1, one complete magnetron assembly is formed as a ring structure located on the left side part of FIG. 1, where the two left magnetron assembly portions 107-A and 107-B are cross-sectional portions of that left magnetron assembly. Likewise, the other complete magnetron assembly is formed as a ring structure located on the right part of FIG. 1, where the two right magnetron assembly portions 107-C and 107-D are cross-sectional portions of that right magnetron assembly.

Figure 6:
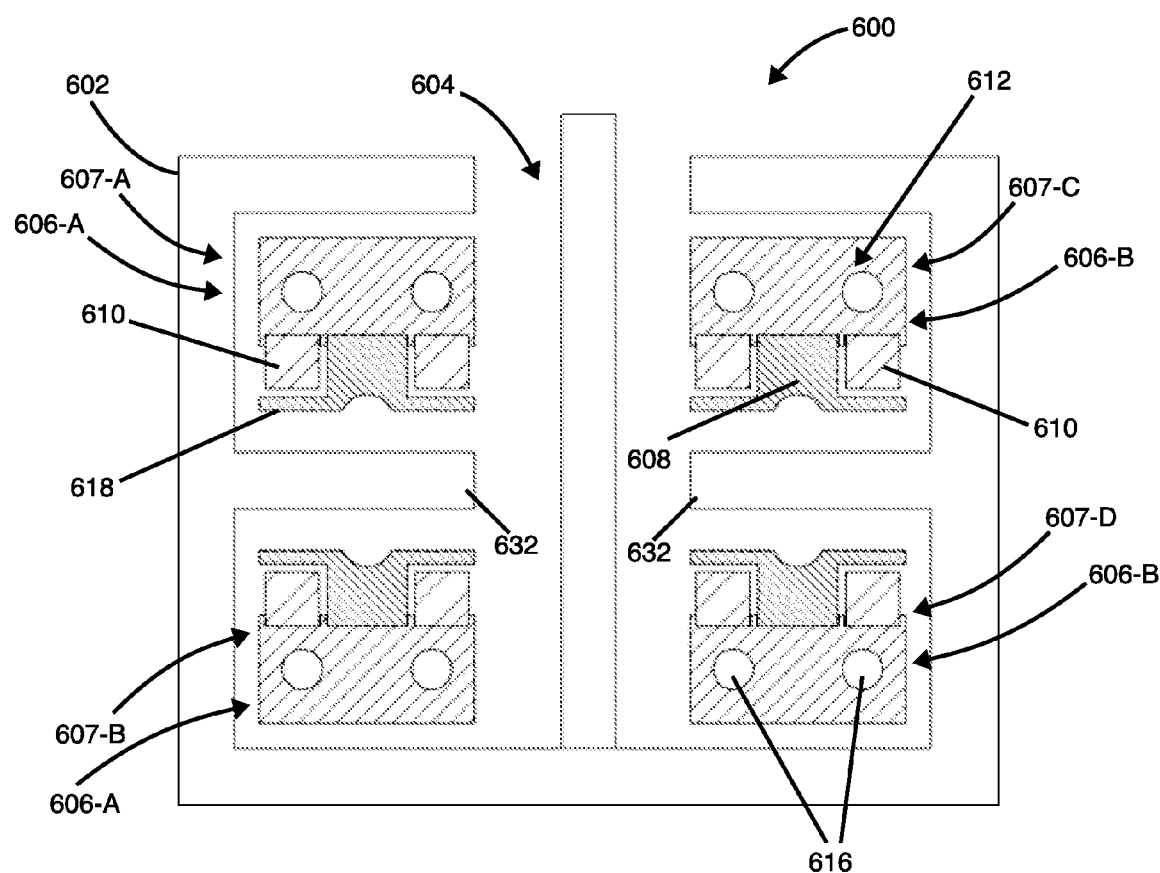
FIG. 6 is a cross-sectional diagram of another exemplary embodiment of a plasma source.

Another alternate embodiment is shown in FIG. 6. FIG. 6 is a cross-sectional diagram of another exemplary embodiment of a plasma source 600. In general, the plasma source 600 shown in FIG. 6 is the same as the plasma source 100 described above in connection with FIGS. 1-5, except as described below. The elements of the exemplary embodiment shown in FIG. 6 that are similar to corresponding elements of the exemplary embodiment shown in FIG. 1 are referenced in FIG. 6 using the same reference numerals used in FIG. 1 but with the leading numeral changed from a "1" to a "6". Except as described below, the description of the elements set forth above in connection with the exemplary embodiment shown in FIGS. 1-5 applies to the corresponding elements of the exemplary embodiment shown in FIG. 6 but generally will not be repeated here in connection with FIG. 6 for the sake of brevity.

In the embodiment shown in FIG. 6, the active surfaces of the electrodes 608 can be oriented towards each other. In this configuration, a deposition shield 632 is disposed between the two electrodes 608 to prevent sputtered material from one area of an electrode 608 from re-depositing onto other electrode areas. The polarities of the magnets 610 can be oriented in any direction that provides processing advantage. In other embodiments, which are variations of the embodiment shown in FIG. 6, the active surfaces of the electrodes face away from each other or both face in the same direction.

The embodiments noted above in connection with FIG. 6 can be configured in two ways. In the first configuration, one complete magnetron assembly 606-A is formed as a ring structure located on the left side of FIG. 6 that surrounds the deposition shield 632, where the two magnetron assembly portions 607-A and 607-B are on the left side of FIG. 6 are cross-sectional portions of that left magnetron assembly 606-A. Likewise, the other complete magnetron assembly 606-B is formed as a ring structure located on the right side of FIG. 6 that surrounds the deposition shield 632, where the two magnetron assembly portions 607-C and 607-D are on the right side of FIG. 6 are cross-sectional portions of that right magnetron assembly 606-B. In this first configuration, the active surface is the interior surface of the ring structure of each magnetron assembly 606. In the second configuration, one complete magnetron assembly is formed as a ring structure located on the upper part of FIG. 6 that surrounds the process gas manifold 624, where the two upper magnetron assembly portions 607-A and 607-C are cross-sectional portions of that upper magnetron assembly. Likewise, the other complete magnetron assembly is formed as a ring structure located on the lower part of FIG. 6 where the lower magnetron assembly surrounds the deposition shield 632 and where the two lower magnetron assembly portions 607-B and 607-D are cross-sectional portions of that lower magnetron assembly. In this second configuration, the active surface of the upper magnetron assembly has a planar geometry facing downward, and the active surface of the lower magnetron assembly has a planar geometry facing upward. In this second configuration, the active surface has an annular geometry.

Figure 7:
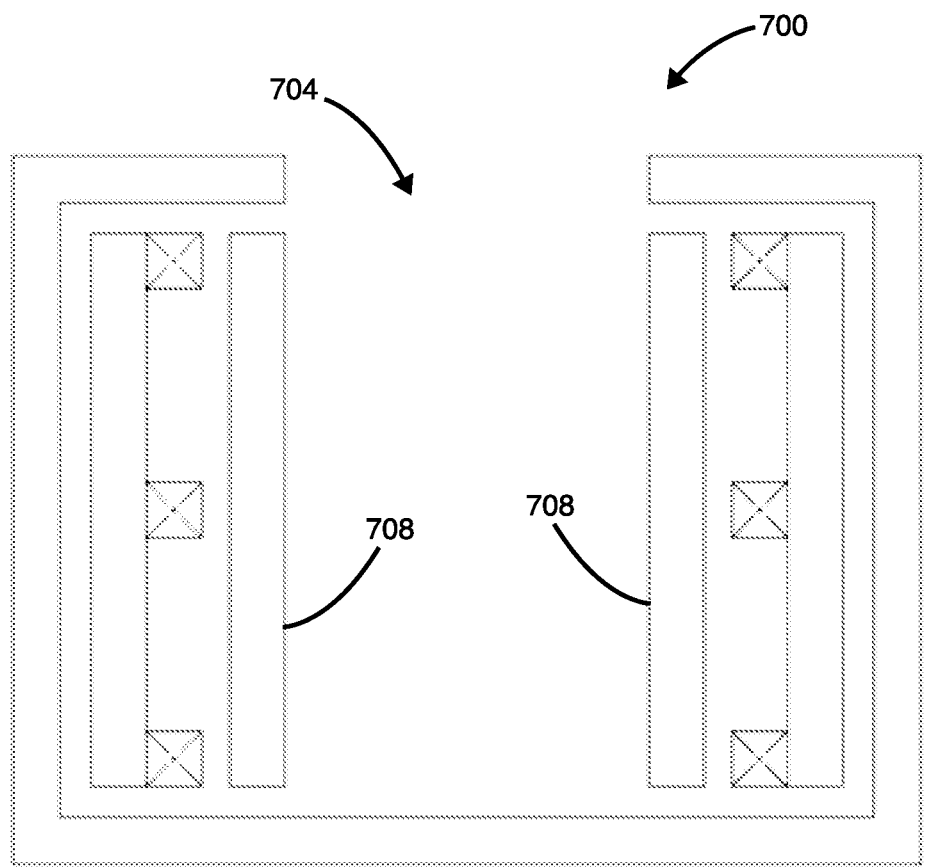
FIG. 7 is a cross-sectional diagram of another exemplary embodiment of a plasma source.

Another alternate embodiment is shown in FIG. 7. In this embodiment, the plasma source 700 comprise two standard planar magnetrons 706 disposed within a cavity 704 with the active surfaces of the electrodes 708 facing each other. A deposition shield (not shown) disposed between the electrodes 708 may be desirable.

Additional alternative embodiments, where the orientations of the active surfaces are turned in the opposite direction, are possible. In one example alternative embodiment where ring structures are used, the active surface could be the outer diameter of the magnetron assemblies rather than the inner diameter and would face the walls of the body. In such an embodiment, the opening of the cavity to the main chamber could be a circle. In another example alternative embodiment, a conical structure could be used (rather than a cylindrical ring geometry), such that the opening to the chamber could be smaller than that of a cylindrical source and the efflux convergent. Or, the opening can be larger and the efflux divergent. In the example of planar magnetrons described above in connection with FIG. 7, the active surfaces could be facing substantially away from each other. In this case, there may by two linear output slits. A variation of this embodiment is that the active surfaces of the two electrodes could be at an angle, relative to each other. This can result in the two output slits being farther apart, with diverging efflux. Or the slits can be moved closer together, perhaps being combined into one slit, with converging efflux.

Any of the embodiments described herein could optionally have more than two electrodes. Two or more electrodes can be closed-drift magnetrons. In embodiments containing more than two electrodes, the additional electrodes can be powered by separate power supplies. Alternately, multiple electrodes can be powered from a single output from a power supply, in which case multiple electrodes will be at the same potential. Another alternative is that each electrode can be powered from different taps on the output coil of an AC power supply, in which case each electrode can go to different electrical potentials. In the case of multiple taps on the output coil of an AC power supply, in one example, a single magnetron assembly connected to a center tap, and two non-magnetron electrodes connected to the outer taps, could be used. The two non-magnetron electrodes constitute a set of redundant anodes. One anode electrode per half-cycle will go to a negative potential with twice the magnitude of the cathode. This will provide sputter cleaning of the anodes, but the degree of sputtering may be much less than that of a magnetically enhanced electrode. However, a variation of the redundant anode configuration may allow some magnetic enhancement due to fringe magnetic fields from the adjacent magnetron assembly. One skilled in the art will recognize that there are other permutations that combine the variations described here.

Figure 8:
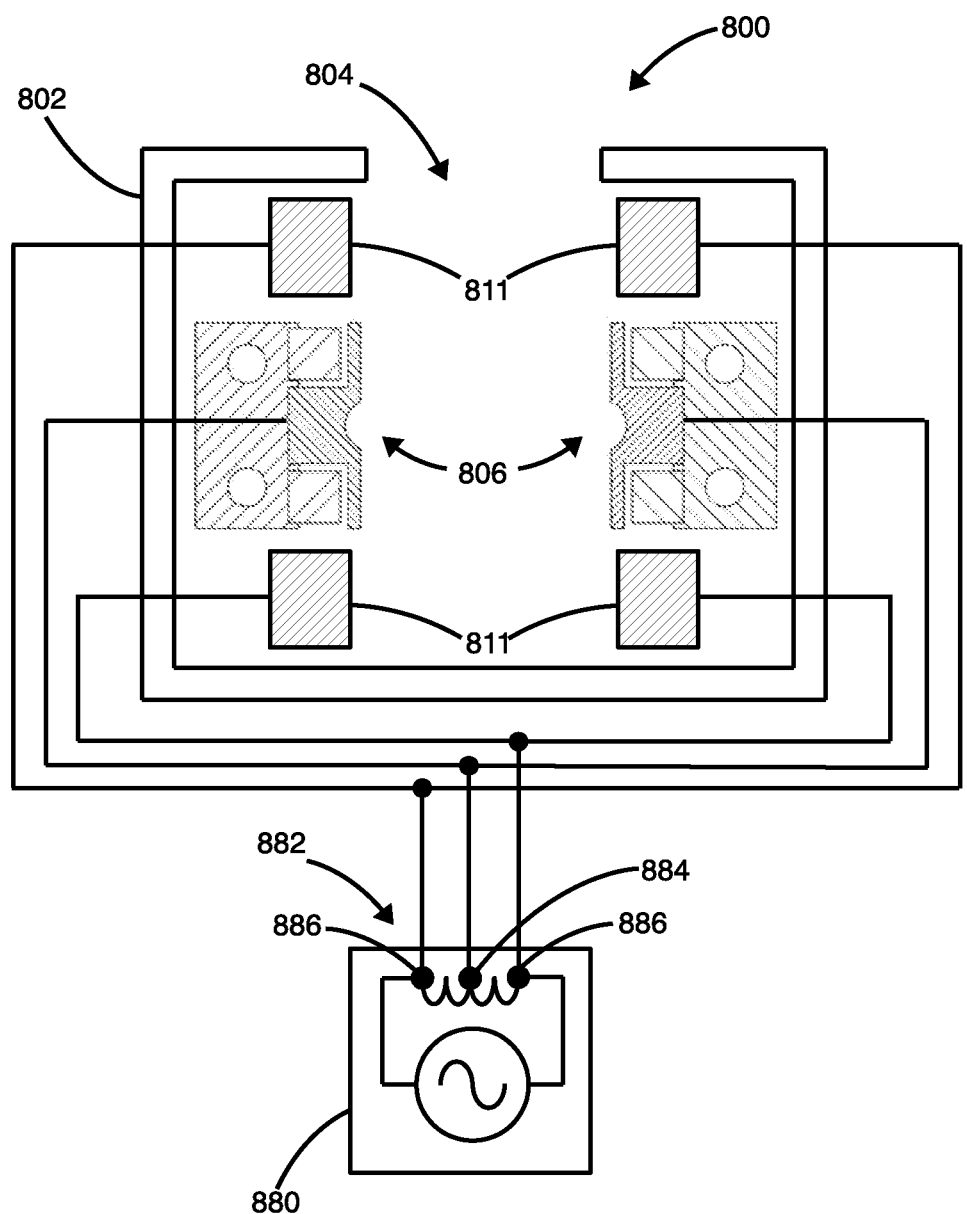
FIG. 8 is a cross-sectional diagram of another exemplary embodiment of a plasma source.

One such permutation is shown in FIG. 8. FIG. 8 is a cross-sectional diagram of an alternative embodiment of a plasma source 800. The plasma source 800 is similar to the plasma source 100 described above in connection with FIG. 1, except as described below.

Plasma source 800 comprises a body 802 in which a cavity 804 is formed. The plasma source 800 also comprises at least one self-contained magnetron assembly 806 disposed within the cavity 804. In one implementation of the embodiment shown in FIG. 8, the magnetron assembly 802 comprises a closed-drift magnetron assembly.

In the embodiment shown in FIG. 8, the plasma source 800 further comprises at least two non-magnetron electrodes 811 disposed within the cavity 804 and an alternating current (AC) power supply 880 having an output coil 882. The non-magnetron electrodes 811 are mutually electrically isolated from each other and from the body 802 incorporating the cavity 804. The non-magnetron electrodes 811 can be mutually electrically isolated from each other and from the body 802 in the same ways that the magnetron assemblies 106 of the plasma source 100 shown in FIG. 1 can be mutually electrically isolated from each other and from the body 102.

In the embodiment shown in FIG. 8, the magnetron assembly 806 is connected to a center tap 884 of the output coil 882 of the AC power supply 880 and the non-magnetron electrodes 811 are connected to end taps 886 of the output coil 882 of the AC power supply 880. In this embodiment, the non-magnetron electrodes 811 may experience some magnetic enhancement from the adjacent magnetron assembly 806.

Example Embodiments

Example 1 includes a plasma source comprising: a body in which a cavity is formed; and at least two self-contained magnetron assemblies disposed within the cavity; wherein the magnetron assemblies are mutually electrically isolated from each other and from the body.

Example 2 includes the plasma source of Example 1, wherein the magnetron assemblies comprise closed-draft magnetron assemblies.

Example 3 includes the plasma source of any of the Examples 1-2, wherein each of the magnetron assemblies comprises at least one electrode, at least one magnet, and a cooling sub-system.

Example 4 includes the plasma source of Example 3, wherein at least one of the magnetron assemblies comprises a core to which at least one of the electrode and the magnet are connected.

Example 5 includes the plasma source of Example 4, wherein the cooling sub-system in at least one of the magnetron assemblies comprises at least one channel formed in the core.

Example 6 includes the plasma source of any of the Examples 4-5, wherein the cooling sub-system in at least one of the magnetron assemblies comprises at least one channel formed in a target portion of at least one electrode included in the magnetron assembly.

Example 7 includes the plasma source of any of the Examples 1-6, further comprising a manifold or conduit to distribute a process gas within the plasma source.

Example 8 includes the plasma source of Example 7, wherein the manifold or conduit to distribute the process gas comprises a binary manifold.

Example 9 includes the plasma source of any of the Examples 1-8, further comprising a manifold or conduit to distribute a precursor gas.

Example 10 includes the plasma source of any of the Examples 1-9, wherein at least one power supply is connected between the magnetron assemblies so that respective electrodes in the magnetron assemblies are alternately biased to have polarities opposite to one another.

Example 11 includes the plasma source of Example 10, wherein the at least one power supply comprises at least one of an alternating current power supply and a bi-polar pulsed power supply.

Example 12 includes the plasma source of any of the Examples 1-11, wherein plasma source is configured so that the body of the plasma source is at one of a floating potential or ground potential.

Example 13 includes the plasma source of any of the Examples 1-12, wherein plasma source is configured so that the body of the plasma source is biased to a particular non-ground potential.

Example 14 includes the plasma source of any of the Examples 1-13, wherein the magnetron assemblies comprise planar magnetrons.

Example 15 includes a method of sourcing plasma comprising: supplying a process gas to a cavity formed within a body of a plasma source, the plasma source comprising at least two self-contained magnetron assemblies disposed within the cavity, wherein the magnetron assemblies are mutually electrically isolated from each other and from the body; alternately biasing respective electrodes in the magnetron assemblies to have polarities opposite to one another; and directing the plasma substantially towards a substrate.

Example 16 includes the method of Example 15, further comprising directing a supply of precursor gas into the plasma in the vicinity of the substrate.

Example 17 includes the method of any of the Examples 15-16, wherein the magnetron assemblies comprise closed-draft magnetron assemblies.

Example 18 includes the method of any of the Examples 15-17, wherein supplying the process gas comprises supplying the process gas using a binary manifold.

Example 19 includes the method of any of the Examples 15-18, wherein supplying the precursor gas comprises supplying the precursor gas using a binary manifold.

Example 20 includes a plasma source comprising: a body in which a cavity is formed; at least one self-contained magnetron assembly disposed within the cavity; at least two non-magnetron electrodes disposed within the cavity; and an alternating current (AC) power supply having an output coil; wherein the at least two non-magnetron electrodes are mutually electrically isolated from each other and from the body incorporating the cavity; and wherein the magnetron assembly is connected to a center tap of the output coil of the AC power supply and the non-magnetron electrodes are connected to end taps of the output coil of the AC power supply.

A number of embodiments have been described. Nevertheless, it will be understood that various modifications to the described embodiments may be made without departing from the spirit and scope of the claimed invention. Also, combinations of the individual features of the above-described embodiments are considered within the scope of the inventions disclosed here.

What is claimed:

1. A plasma source comprising:
a body in which a cavity is formed; and
at least two self-contained magnetron assemblies disposed within the cavity;
wherein the magnetron assemblies are mutually electrically isolated from each other and from the body.

2. The plasma source of claim 1, wherein the magnetron assemblies comprise closed-draft magnetron assemblies.

3. The plasma source of claim 1, wherein each of the magnetron assemblies comprises at least one electrode, at least one magnet, and a cooling sub-system.

4. The plasma source of claim 3, wherein at least one of the magnetron assemblies comprises a core to which at least one of the electrode and the magnet are connected.

5. The plasma source of claim 4, wherein the cooling sub-system in at least one of the magnetron assemblies comprises at least one channel formed in the core.

6. The plasma source of claim 4, wherein the cooling sub-system in at least one of the magnetron assemblies comprises at least one channel formed in a target portion of at least one electrode included in the magnetron assembly.

7. The plasma source of claim 1, further comprising a manifold or conduit to distribute a process gas within the plasma source.

8. The plasma source of claim 7, wherein the manifold or conduit to distribute the process gas comprises a binary manifold.

9. The plasma source of claim 1, further comprising a manifold or conduit to distribute a precursor gas.

10. The plasma source of claim 1, wherein at least one power supply is connected between the magnetron assemblies so that respective electrodes in the magnetron assemblies are alternately biased to have polarities opposite to one another.

11. The plasma source of claim 10, wherein the at least one power supply comprises at least one of an alternating current power supply and a bi-polar pulsed power supply.

12. The plasma source of claim 1, wherein plasma source is configured so that the body of the plasma source is at one of a floating potential or ground potential.

13. The plasma source of claim 1, wherein plasma source is configured so that the body of the plasma source is biased to a particular non-ground potential.

14. The plasma source of claim 1, wherein the magnetron assemblies comprise planar magnetrons.

15. A method of sourcing plasma comprising:
supplying a process gas to a cavity formed within a body of a plasma source, the plasma source comprising at least two self-contained magnetron assemblies disposed within the cavity, wherein the magnetron assemblies are mutually electrically isolated from each other and from the body;
alternately biasing respective electrodes in the magnetron assemblies to have polarities opposite to one another; and
directing the plasma substantially towards a substrate.

16. The method of claim 15, further comprising directing a supply of precursor gas into the plasma in the vicinity of the substrate.

17. The method of claim 15, wherein the magnetron assemblies comprise closed-draft magnetron assemblies.

18. The method of claim 15, wherein supplying the process gas comprises supplying the process gas using a binary manifold.

19. The method of claim 15, wherein supplying the precursor gas comprises supplying the precursor gas using a binary manifold.

20. A plasma source comprising:
a body in which a cavity is formed;
at least one self-contained magnetron assembly disposed within the cavity;
at least two non-magnetron electrodes disposed within the cavity; and
an alternating current (AC) power supply having an output coil;
wherein the at least two non-magnetron electrodes are mutually electrically isolated from each other and from the body incorporating the cavity; and
wherein the magnetron assembly is connected to a center tap of the output coil of the AC power supply and the non-magnetron electrodes are connected to end taps of the output coil of the AC power supply.

* * * * *